United States Patent [19]

Baker

[11] Patent Number: 4,795,353
[45] Date of Patent: Jan. 3, 1989

[54] LOCKING CLIP

[75] Inventor: Robert W. Baker, Harrow, England

[73] Assignee: AMP Incorporated, Harrisburg, Pa.

[21] Appl. No.: 121,002

[22] Filed: Nov. 16, 1987

[30] Foreign Application Priority Data

Dec. 8, 1986 [GB] United Kingdom ............... 8629275

[51] Int. Cl.$^4$ ......................................... H01R 13/652
[52] U.S. Cl. ....................................... 439/92; 24/295;
24/453; 439/82; 439/554
[58] Field of Search ................................... 439/82–84,
439/92, 573, 575, 607, 554, 557; 174/138;
24/293, 295, 297, 453, 458; 411/508–510

[56] References Cited

U.S. PATENT DOCUMENTS

| | | | |
|---|---|---|---|
| 2,537,662 | 1/1951 | Flora et al. | 24/293 |
| 2,629,157 | 2/1953 | O'Herron | 24/453 |
| 3,479,634 | 11/1969 | Pritulsky | 339/17 |
| 3,486,158 | 12/1969 | Soltysik et al. | 439/92 |
| 3,488,628 | 1/1970 | Lundergan et al. | 339/258 |
| 3,500,300 | 3/1970 | Lundergan et al. | 339/258 |
| 3,553,634 | 1/1971 | Lundergan et al. | 339/258 |
| 3,553,635 | 1/1971 | Lundergan et al. | 339/258 |

OTHER PUBLICATIONS

AMP Incorporated Preliminary Information Bulletin, "Printed Circuit Board Fastener," P10-6, Aug. 1966.
AMP Incorporated Brochure, "Printed Circuit Interconnections/Packaging Devices," No. 902–909, Dec. 1970.

Primary Examiner—Eugene F. Desmond
Attorney, Agent, or Firm—Thomas G. Terrell; Bruce J. Wolstoncroft

[57] ABSTRACT

A one-piece, stamped and formed C-section locking clip for insertion into aligned holes (H1 and H2) in a superposed metal plate (P) and circuit board (CB) to secure them together for soldering the clip to the plate (P) and to a ground plane (G) on the board (CB) comprises a body (2) having a resilient and compliant larger diameter portion (6) for reception in the hole (H1) in plate (P), a smaller diameter portion (12) for reception in the hole (H2) in the board (CB). A spring (16) extending from the upper edge (8) of the body (2) extends for substantially the full length thereof and has at its lower end an outwardly bowed part (22) for engaging the ground plane (G) and holding the locking clip in position for the soldering operation.

17 Claims, 2 Drawing Sheets

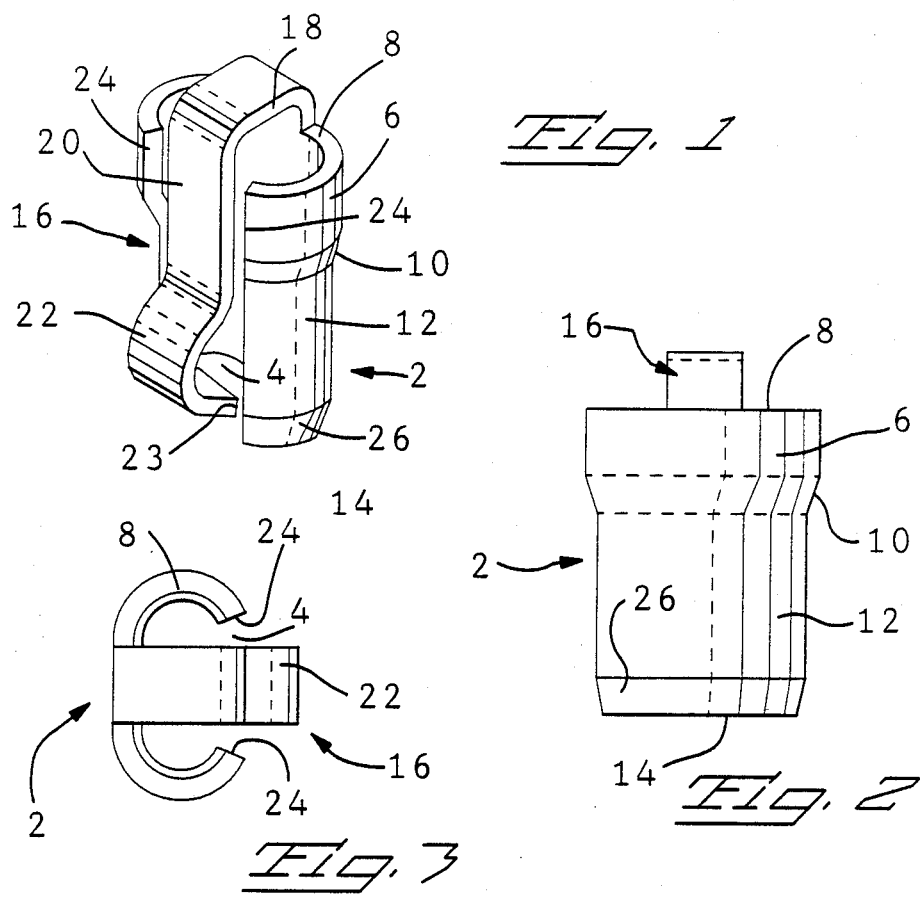
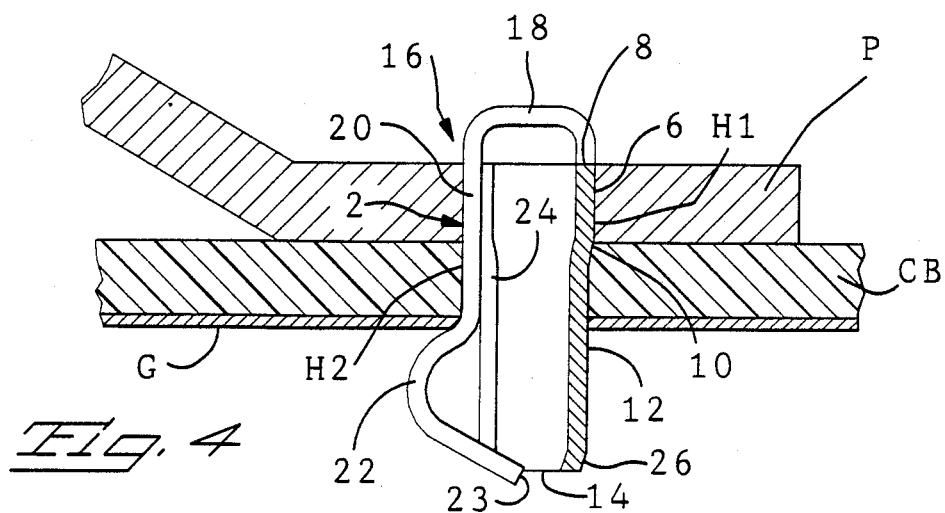

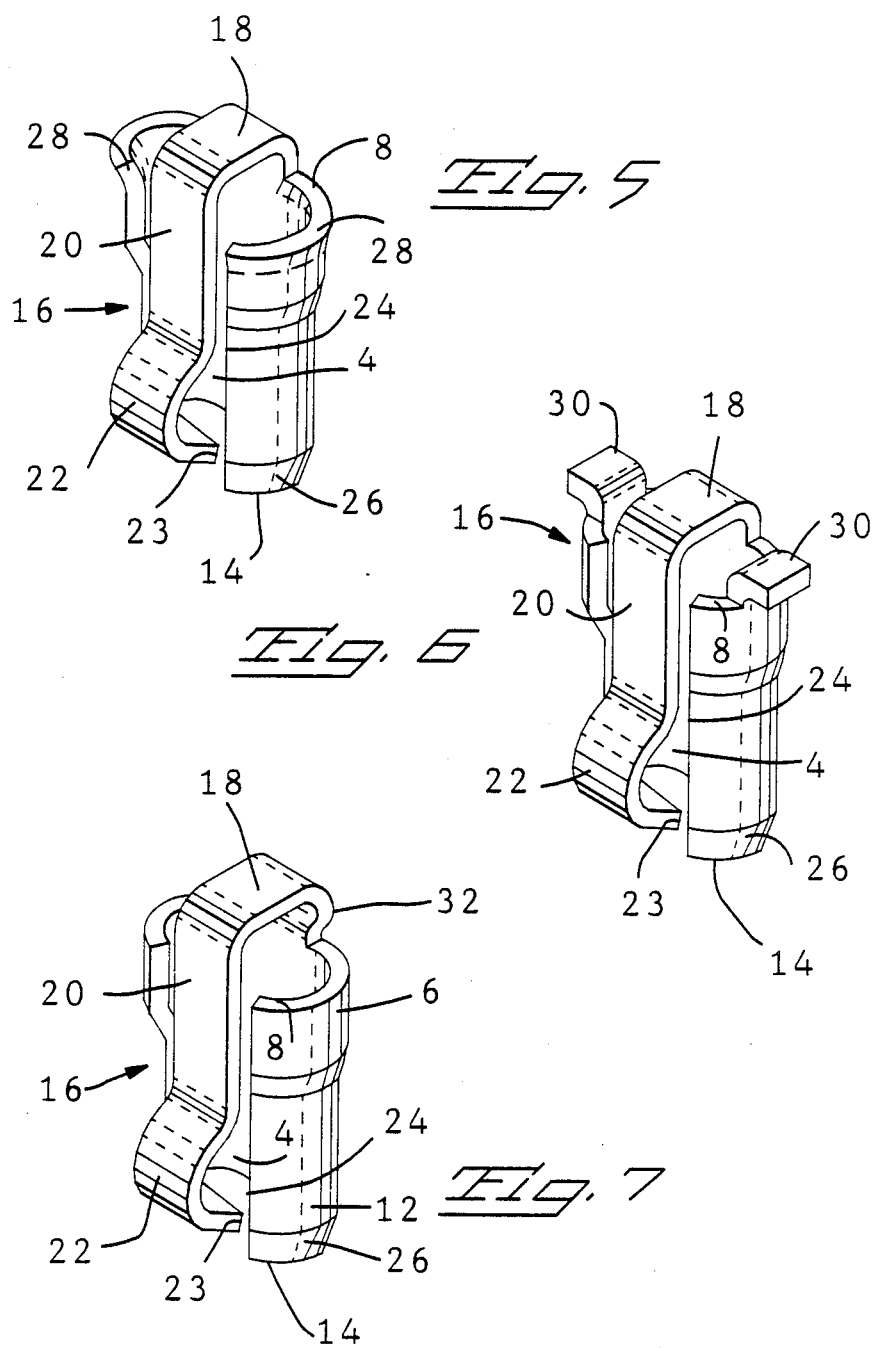

LOCKING CLIP

This invention relates to a locking clip which can be inserted into aligned holes in a superposed metal plate and a circuit board, to secure the plate to the board.

A shielded electrical connector for mounting on a circuit board may comprise a bracket in the form of a metal plate which is electrically connected to the connector shield. The plate is formed with a hole which is aligned with a corresponding hole in the circuit board and a metal element is inserted through both of the holes and is subsequently soldered to a ground plane on the underside of the circuit board, thereby to provide an electrical connection between the shield and the ground plane.

According to one aspect of the invention, a stamped and formed one-piece locking clip comprises an elongate body which is of substantially C-shaped cross section and thereby defines a slot extending longitudinally of the body, the body having a resilient and compliant first portion of major diameter and having a first peripheral edge at one end of the body, the first portion merging with a second portion of the body, of smaller diameter than, but of greater length than, the first portion thereof, and having a second peripheral edge at the other end of the body, a locking spring having a first part extending from said first peripheral edge at a position opposite to the slot, to a position beyond the slot, an intermediate part extending lengthwise of the slot, and an end part which is bowed away from the body at a position proximate to said second peripheral edge, and having a free edge projecting in the inward direction of the slot.

According to another aspect of the invention, a stamped and formed, one piece, locking clip for insertion in aligned holes in a superposed metal plate and a circuit board, to secure the plate to the board, comprises an elongate body which is of substantially C-shaped cross section and thereby defines a slot extending longitudinally of the body, the body having a resilient and compliant first portion of major diameter for insertion into the hole in the plate and having a first peripheral edge at one end of the body, said first portion merging with a second portion of the body which is of smaller diameter than the first portion for insertion into the hole in the circuit board, the second portion of the body having a second peripheral edge at the other end of the body, the locking clip further comprising a locking spring having a first part extending from said first peripheral edge at a position opposite to said slot, to a position beyond said slot, an intermediate part extending lengthwise of said slot and an end part which is bowed away from said body at a position proximate to said second peripheral edge, for engaging a ground plane on the side of the circuit board which is remote from said metal plate.

The resilient and compliant first portion of the body serves to retain the locking clip in the hole in the metal plate whilst the second portion of the body is inserted through the hole in the circuit board, the bowed end part of the spring serving to hold the metal plate and the circuit board together, for placement in a wave soldering machine in which the locking clip is soldered both to the ground plane on the circuit board and to the metal plate. During the soldering operation, solder wicks up through the body, which is preferably tin plated, to solder it to the metal plate.

The said first part of the locking spring is preferably bowed outwardly of the body and its free end preferably projects in the direction of the slot.

By virtue of the long lever length of the spring, which extends over substantially the full length of the body, the force needed to insert the second portion of the body into the hole in the circuit board is desirably low.

The length of the second portion of the body may conveniently be twice that of the first portion, and the said second peripheral edge thereof may be chamfered to facilitate the insertion of the body through the holes in the plate and the circuit board.

The said first peripheral edge of the first portion of the body may be provided with radially outwardly projecting means in order to limit the insertion of the body through the holes and to support the body on the metal plate. To this end, said first peripheral edge may be provided with a radially outwardly extending rim, or, for example, with radially outwardly extending flanges, or the spring may be bent so as to extend radially outwardly of the first peripheral edge in the vicinity of its junction therewith.

The spring is preferably of elongate cross section in a direction at right angles to the length of the slot so as to extend across the greater part of the width of the slot, the thickness of the spring being the same as that of the stock from which the remainder of the locking clip was formed.

For a better understanding of the invention and to show how it may be carried into effect, reference will now be made by way of example to the accompanying drawings in which:

FIG. 1 is an isometric view of a stamped and formed, one-piece locking clip for insertion into aligned holes in a superposed metal plate and a circuit board to secure the plate to the board;

FIGS. 2 and 3 are a side view, and a top plan view, respectively, of the locking clip;

FIG. 4 is a sectional view illustrating the locking clip in use; and

FIGS. 5 to 7 are perspective views illustrating respective modifications of the locking clip.

The locking clip shown in FIGS. 1 to 4, which has been stamped and formed from a single piece of metal stock, comprises an elongate body 2 which is of substantially C-shaped cross section, as best seen in FIG. 3, and therefore defines a slot 4 extending longitudinally of the body 2. The body 2 has a resilient and compliant first portion 6 of major diameter, having a peripheral edge 8 at the upper end of the body 2. The portion 6 merges at 10 with a second portion 12 of the body 2 which is of smaller diameter than the first portion 6 but is of approximately twice the length thereof and has a peripheral edge 14 at the lower end of the body 2. A locking spring 16 has a first part 18 extending from the edge 8 at a position opposite to the slot 4, to a position beyond the slot 4, in a direction radially outward of the body 2, an intermediate rectilinear part 20 extending lengthwise of the slot 4 and outside of the body 2, and an end part 22 which is bowed away from the body 2 at a position proximate to its edge 14, the part 22 having a free end 23 directed inwardly of the slot 4.

The part 18 of the spring 16, which is smoothly arcuate, is bowed away from the edge 8 and outwardly of the body 2. The slot 4 is defined by parallel rectilinear edges 24 and extends about approximately one-third of the circumference of the body 2. The edge 14 is chamfered at 26.

The spring 16, which is of the same stock thickness as the body 2, is of elongate cross section at right angles to the length of the body 2 so as to extend the greater part of the width of the slot 4.

FIG. 4 shows an assembly comprising a metal plate P is superposed with a circuit board CB having on its face remote from the plate P, a grounding plane G. The plate P has a circular hole H1 there through, the circuit board CB having a circular through hole H2 there through. The plate P may be part of a mounting bracket of a shielded electrical connector (not shown), the shield of which is connected electrically to the plate P for grounding purposes. The connector may have contact tails projecting therefrom for mounting in further holes (not shown) in the circuit board CB. For use in the construction of the said assembly, the locking clip is first inserted through the hole H1, with the chamfered edge of the body 2 leading, before the plate P is assembled to the circuit board CB. The locking clip is inserted through the hole H1, to the extent that its resilient and compliant portion 6 is received therein, being resiliently compressed, slightly, by the wall of the hole H1, so that the locking clip is retained therein. The portion 12 of the body 2 is then inserted through the hole H2 in the circuit board CB, guided by its chamfered edge 26, the crest of the bowed portion 22 of the spring 16 engaging the wall of the hole H2 and being thereby resiliently deflected inwardly of the body 2 until the portion 22 emerges from the lower end of the hole H1 so that the spring 16 thereby resiles so that its part 22 overlies the grounding plate G thereby restraining withdrawal of the locking clip from the holes H1 and H2. The circuit board is then transferred to a wave soldering machine in which the locking clip is soldered to the ground plane G and the plate P. During the soldering operation, solder wicks up the body 2, which is preferably tin plated, so as to solder the portion 6 thereof to the plate P whereby secure electrical connection is provided between the plate P and the ground plane G.

As shown in FIGS. 5 to 7, in which parts that are the same as those described above bear the same reference numerals, the portion 6 of the body 2 may be provided with means extending radially outwardly of the edge 8 for positively limiting the insertion of the locking clip into the holes H1 and H2 and for supporting it on the plate P. As shown in FIG. 5, such radially extending means may comprise radially outwardly projecting rims 28 extending about a part of the periphery of the edge 8; as shown in FIG. 6, the said means may comprise a pair of flanges 30 projecting from the rim 8 radially outwardly of the body 2; and as shown in FIG. 7, the part 18 of the spring 16 may be sharply radiused at 32 proximate to its junction with the edge 8 so as to project radially outwardly of the body 2.

I claim:

1. A stamped and formed one-piece locking clip, comprising an elongate body which is of substantially C-shaped cross section and thereby defines a slot extending longitudinally of the body, the body having a resilient and compliant first portion of major diameter and having a first peripheral edge at one end of the body, the first portion merging with a second portion of the body, of smaller diameter than, but of greater length than, the first portion thereof, and having a second peripheral edge at the other end of the body, a locking spring having a first part extending from said first peripheral edge at a position opposite to the slot, to a position beyond the slot, an intermediate part extending lengthwise of the slot and an end part which is bowed away from the body at a position proximate to said second peripheral edge, and having a free edge projecting in the inward direction of the slot.

2. A locking clip as claimed in claim 1, in which said second portion is approximately twice the length of said first portion.

3. A locking clip as claimed in claim 1, in which the first part of the spring is bowed outwardly of said first peripheral edge and outwardly of the body and is smoothly arcuate.

4. A locking clip as claimed in claim 1, in which said slot has parallel longitudinal edges and extends about approximately one-third of the periphery of the body, the slot being of constant width.

5. A locking clip as claimed in claim 1, in which the spring is of elongate cross section in a direction at right angles to the length of the body, so as to extend across the greater part of the width of the slot.

6. A locking clip as claimed in claim 1, in which said intermediate part extends outside said body.

7. A locking clip as claimed in claim 1, having stop means projecting radially outwardly of said first peripheral edge.

8. A locking clip as claimed in claim 7, in which said stop means comprises at least one rim extending from said first peripheral edge.

9. A locking clip as claimed in claim 7, in which said stop means comprises a pair of opposed flanges extending from said first peripheral edge.

10. A locking clip as claimed in claim 7, in which said stop means comprises a radiused portion of the first part of the spring.

11. A stamped and formed one-piece locking clip for insertion into aligned holes in a superposed metal plate and a circuit board to secure the plate to the board, the locking clip comprising an elongate body which is of substantially C-shaped cross section and thereby defines a slot extending longitudinally of the body, the body having a resilient and compliant first portion of major diameter, for insertion into the hole in the plate and having a firt peripheral edge at one end of the body, the first portion merging with a second portion of the body, which is of smaller diameter than the first portion, for insertion into the hole in the circuit board and having a second peripheral edge at the other end of the body, a locking spring having a first part extending from said first peripheral edge at a position opposite to said slot, to a position beyond said slot, an intermediate part extending lengthwise of said slot, opposite thereto, and an end part which is bowed away from said body at a position proximate to said second peripheral edge, for engaging a ground plane on the side of the circuit board remote from the metal plate.

12. A locking clip as claimed in claim 11, in which said second portion is approximately twice the length of said first portion.

13. A locking clip as claimed in claim 11, in which the first part of the spring is bowed outwardly of said first peripheral edge and outwardly of the body and is smoothly arcuate and in which said slot has parallel longitudinal edges and extends about approximately one-third of the periphery of the body, the slot being of constant width.

14. A locking clip as claimed in claim 11, in which the spring is of elongate cross section in a direction at right angles to the length of the body, so as to extend across the greater part of the width of the slot, stop means projecting radially outwardly of said first peripheral edge.

15. A locking clip as claimed in claim 14, in which said stop means comprises at least one rim extending from said first peripheral edge.

16. A locking clip as claimed in claim 14, in which said stop means comprises a pair of opposed flanges extending from said first peripheral edge.

17. A locking clip as claimed in claim 14, in which said stop means comprises a radiused portion of the first part of the spring.

* * * * *